(12) United States Patent
Koetting

(10) Patent No.: US 8,449,998 B2
(45) Date of Patent: May 28, 2013

(54) BATTERY SYSTEM AND METHOD FOR INCREASING AN OPERATIONAL LIFE OF A BATTERY CELL

(75) Inventor: William Koetting, Davisburg, MI (US)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 13/093,187

(22) Filed: Apr. 25, 2011

(65) Prior Publication Data

US 2012/0270077 A1    Oct. 25, 2012

(51) Int. Cl.
*H01M 10/44* (2006.01)

(52) U.S. Cl.
USPC .............. 429/50; 429/61; 429/90; 429/91; 429/99

(58) Field of Classification Search
CPC ........................................ H01M 10/44
USPC ................... 429/50, 61, 90, 91, 99
See application file for complete search history.

(56) References Cited

U.S. PATENT DOCUMENTS

| | | | |
|---|---|---|---|
| 4,390,841 A | | 6/1983 | Martin et al. |
| 5,578,915 A | | 11/1996 | Crouch, Jr. et al. |
| 5,606,242 A | | 2/1997 | Hull et al. |
| 5,644,212 A | | 7/1997 | Takahashi |
| 5,650,712 A | * | 7/1997 | Kawai et al. ........... 324/427 |
| 5,652,502 A | * | 7/1997 | van Phuoc et al. ....... 702/63 |
| 5,658,682 A | | 8/1997 | Usuda et al. |
| 5,659,235 A | | 8/1997 | Yamada et al. |
| 5,666,041 A | | 9/1997 | Stuart et al. |
| 5,694,335 A | | 12/1997 | Hollenberg |
| 5,701,068 A | | 12/1997 | Baer et al. |
| 5,714,866 A | | 2/1998 | S et al. |
| 5,739,670 A | | 4/1998 | Brost et al. |
| 5,773,955 A | | 6/1998 | Hall |
| 5,796,239 A | | 8/1998 | van Phuoc et al. |
| 5,825,155 A | | 10/1998 | Ito et al. |
| 5,861,732 A | | 1/1999 | Takimoto et al. |

(Continued)

FOREIGN PATENT DOCUMENTS

| | | |
|---|---|---|
| JP | 9243716 A | 9/1997 |
| JP | 9312901 A | 12/1997 |

(Continued)

OTHER PUBLICATIONS

International Search Report dated Jul. 25, 2005 for International Application No. PCT/KR2004/003103.

(Continued)

*Primary Examiner* — Patrick Ryan
*Assistant Examiner* — Alex Usyatinsky
(74) *Attorney, Agent, or Firm* — Buckert Patent & Trademark Law Firm, P.C.

(57) ABSTRACT

A battery system and a method for increasing an operational life of a battery cell are provided. The battery system includes a voltage sensor that generates a first signal indicative of a voltage level output by the battery cell, and a current sensor that generates a second signal indicative of a level of electrical current flowing through the battery cell. The battery system further includes a microprocessor that calculates a resistance level of the battery cell based on the first and second signals, and generates a control signal to induce a fluid supply system to increase a pressure level of the coolant fluid being supplied to the heat exchanger to a first pressure level, based on the resistance level.

7 Claims, 8 Drawing Sheets

U.S. PATENT DOCUMENTS

| | | | |
|---|---|---|---|
| 5,936,385 | A | 8/1999 | Patillon et al. |
| 5,982,403 | A | 11/1999 | Inagaki |
| 6,016,047 | A | 1/2000 | Notten et al. |
| 6,064,180 | A | 5/2000 | Sullivan et al. |
| 6,133,712 | A | 10/2000 | Yeon |
| 6,160,376 | A | 12/2000 | Kumar et al. |
| 6,232,744 | B1 | 5/2001 | Kawai et al. |
| 6,278,257 | B1 | 8/2001 | Takada et al. |
| 6,285,163 | B1 | 9/2001 | Watanabe et al. |
| 6,329,823 | B2 | 12/2001 | Blessing et al. |
| 6,353,815 | B1 | 3/2002 | Vilim et al. |
| 6,359,419 | B1 | 3/2002 | Verbrugge et al. |
| 6,362,598 | B2 | 3/2002 | Laig-Horstebrock et al. |
| 6,407,532 | B1 | 6/2002 | Ruha |
| 6,441,586 | B1 | 8/2002 | Tate, Jr. et al. |
| 6,452,363 | B1 | 9/2002 | Jabaji |
| 6,515,454 | B2 | 2/2003 | Schoch |
| 6,522,148 | B2 | 2/2003 | Ochiai et al. |
| 6,534,954 | B1 | 3/2003 | Plett |
| 6,563,318 | B2 | 5/2003 | Kawakami et al. |
| 6,583,606 | B2 | 6/2003 | Koike et al. |
| 6,608,482 | B2 | 8/2003 | Sakai et al. |
| 6,624,636 | B2 | 9/2003 | Arai et al. |
| 6,646,421 | B2 | 11/2003 | Kimura et al. |
| 6,661,201 | B2 | 12/2003 | Ueda et al. |
| 6,724,172 | B2 | 4/2004 | Koo |
| 6,762,590 | B2 | 7/2004 | Yudahira |
| 6,803,766 | B2 | 10/2004 | Kobayashi et al. |
| 6,829,562 | B2 | 12/2004 | Sarfert |
| 6,832,171 | B2 | 12/2004 | Barsoukov et al. |
| 6,876,175 | B2 | 4/2005 | Schoch |
| 6,882,129 | B2 | 4/2005 | Boskovitch et al. |
| 6,892,148 | B2 | 5/2005 | Barsoukov et al. |
| 6,903,534 | B2 | 6/2005 | Minamiura |
| 6,919,952 | B2 | 7/2005 | Kruit |
| 6,927,554 | B2 | 8/2005 | Tate, Jr. et al. |
| 6,943,528 | B2 | 9/2005 | Schoch |
| 6,967,466 | B2 | 11/2005 | Koch |
| 6,984,961 | B2 | 1/2006 | Kadouchi et al. |
| 7,012,434 | B2 | 3/2006 | Koch |
| 7,039,534 | B1 | 5/2006 | Ryno et al. |
| 7,061,246 | B2 | 6/2006 | Dougherty et al. |
| 7,072,871 | B1 | 7/2006 | Tinnemeyer |
| 7,092,555 | B2 | 8/2006 | Lee et al. |
| 7,098,665 | B2 | 8/2006 | Laig-Hoerstebrock |
| 7,106,026 | B2 | 9/2006 | Moore |
| 7,109,685 | B2 | 9/2006 | Tate, Jr. et al. |
| 7,126,312 | B2 | 10/2006 | Moore |
| 7,136,762 | B2 | 11/2006 | Ono |
| 7,138,775 | B2 | 11/2006 | Sugimoto et al. |
| 7,196,494 | B2 | 3/2007 | Baumgartner |
| 7,197,487 | B2 | 3/2007 | Hansen et al. |
| 7,199,557 | B2 | 4/2007 | Anbuky et al. |
| 7,212,006 | B2 | 5/2007 | Huang |
| 7,233,128 | B2 | 6/2007 | Brost et al. |
| 7,250,741 | B2 | 7/2007 | Koo et al. |
| 7,253,587 | B2 | 8/2007 | Meissner |
| 7,315,789 | B2 | 1/2008 | Plett |
| 7,317,300 | B2 | 1/2008 | Sada et al. |
| 7,321,220 | B2 | 1/2008 | Plett |
| 7,327,147 | B2 | 2/2008 | Koch |
| 7,400,115 | B2 | 7/2008 | Plett |
| 7,424,663 | B2 | 9/2008 | Mehalel |
| 7,446,504 | B2 | 11/2008 | Plett |
| 7,456,612 | B2 | 11/2008 | Murakami |
| 7,489,112 | B2 | 2/2009 | Ishikawa et al. |
| 7,498,772 | B2 | 3/2009 | Palladino |
| 7,518,339 | B2 | 4/2009 | Schoch |
| 7,521,895 | B2 | 4/2009 | Plett |
| 7,525,285 | B2 | 4/2009 | Plett |
| 7,583,059 | B2 | 9/2009 | Cho |
| 7,589,532 | B2 | 9/2009 | Plett |
| 7,593,821 | B2 | 9/2009 | Plett |
| 7,612,532 | B2 | 11/2009 | Verbrugge |
| 7,656,123 | B2 | 2/2010 | Plett |
| 7,663,374 | B2 | 2/2010 | Odaohhara et al. |
| 7,688,074 | B2 | 3/2010 | Cox et al. |
| 7,711,538 | B2 | 5/2010 | Suntio et al. |
| 7,728,599 | B2 | 6/2010 | Tae et al. |
| 7,800,375 | B2 | 9/2010 | Plett |
| 7,884,613 | B2 | 2/2011 | Plett |
| 7,893,694 | B2 | 2/2011 | Plett |
| 7,965,059 | B2 | 6/2011 | Plett |
| 7,969,120 | B2 | 6/2011 | Plett |
| 7,994,755 | B2 | 8/2011 | Plett |
| 8,008,891 | B2 | 8/2011 | Yun et al. |
| 2003/0015993 | A1 | 1/2003 | Misra et al. |
| 2003/0077617 | A1 | 4/2003 | Kim et al. |
| 2003/0184307 | A1 | 10/2003 | Kozlowski et al. |
| 2005/0100786 | A1 | 5/2005 | Ryu et al. |
| 2005/0127874 | A1 | 6/2005 | Lim et al. |
| 2006/0100833 | A1 | 5/2006 | Plett |
| 2007/0120533 | A1 | 5/2007 | Plett |
| 2008/0094035 | A1 | 4/2008 | Plett |
| 2008/0249725 | A1 | 10/2008 | Plett |
| 2009/0325054 | A1* | 12/2009 | Payne et al. .................. 429/120 |
| 2009/0327540 | A1 | 12/2009 | Robertson et al. |
| 2010/0042345 | A1* | 2/2010 | Kang et al. ...................... 702/65 |
| 2011/0257916 | A1 | 10/2011 | Plett |
| 2012/0094165 | A1* | 4/2012 | Valencia et al. ............... 429/120 |

FOREIGN PATENT DOCUMENTS

| | | |
|---|---|---|
| JP | 11003505 A | 1/1999 |
| JP | 11023676 A | 1/1999 |
| JP | 11032442 A | 2/1999 |
| JP | 11038105 A | 2/1999 |
| JP | 11103503 A | 4/1999 |
| JP | 2002075461 A | 3/2002 |
| JP | 2002228730 A | 8/2002 |
| JP | 2002319438 A | 10/2002 |
| JP | 2002325373 A | 11/2002 |
| JP | 2003516618 A | 5/2003 |
| JP | 2003249271 A | 9/2003 |
| JP | 2003257501 A | 9/2003 |
| JP | 2004031014 A | 1/2004 |
| JP | 2004521365 A | 7/2004 |
| JP | 2006516326 A | 6/2009 |
| KR | 19970024432 A | 5/1997 |
| KR | 20020026428 A | 4/2002 |
| KR | 20040077398 A | 9/2004 |
| KR | 100537415 B1 | 12/2005 |
| WO | WO0067359 A1 | 11/2000 |

OTHER PUBLICATIONS

International Search Report dated Mar. 31, 2005 for International Application No. PCT/KR2004/003332.

International Search Report dated Dec. 1, 2006 for International Application No. PCT/KR2006/003305.

S. Moore, P. Schneider; A review of Cell Equalization Methods for Lithium Ion and Lithium Polymer Battery Systems; 2001 Society of Automotive Engineers; Jan. 2001; pp. 1-5.

G. Plett; Advances in EKF SOC Estimation for LiPB HEV Battery Packs; Powering Sustainable Transportation EVS 20; Nov. 15-19, 2003; Long Beach, CA; pp. 1-12.

G. Welch, G. Bishop; An Introduction to the Kalman Filter; SIGGRAPH 2001 Course 8; Los Angeles, CA; Aug. 12-17, 2001; http://info.acm.org/pubs/toc/CRnotice.html, pp. 1-80.

E. Wan, A. Nelson; Dual Extended Kalman Filter Methods; Kalman Filtering and Neural Networks; 2001; pp. 123-173.

Yon et al.; Dynamic Multidimensional Wavelet Neural Network and its Application; Journal of Advanced Computational Intelligence and Intelligent Informatics; 2000; vol. 4, No. 5; pp. 336-340.

Fletcher et al; Estimation from Lossy Sensor Data: Jump Linear Modeling and Kalman Filtering; IPSN Apr. 26-27, 2004; Berkeley, California; pp. 251-258.

G. Plett; Extended Kalman Filtering for Battery Managements System of LiPB-based HEV Battery Packs—Part 1 Background; Journal of Power Sources 134; 2004; pp. 252-261.

G. Plett; Extended Kalman Filtering for Battery Managements System of LiPB-based HEV Battery Packs—Part 2 Background; Journal of Power Sources 134; 2004; pp. 262-276.

G. Plett; Extended Kalman Filtering for Battery Managements System of LiPB-based HEV Battery Packs—Part 3 Background; Journal of Power Sources 134; 2004; pp. 277-283.

G. Plett; Kalman-Filter SOC Estimation for LiPB HEV Cells; The 19th International Battery, Hybrid and Fuel Electric Vehicle Symposium and Exhibition; Oct. 19-23, 2002; Busan, Korea; pp. 1-12.

G. Plett; LiPB Dynamic Cell Models for Kalman-Filter SOC Estimation; The 19th International Battery, Hybrid and Fuel Electric Vehicle Symposium and Exhibition; Oct. 19-23, 2002; Busan, Korea; pp. 1-12.

S.C. Rutan; Recursive Parameter Estimation; 1990; Journal of Chemometrics; vol. 4; pp. 103-121.

P. Maybeck; Stochastic models, estimation and control, vol. 1; 1979; Academic Press Inc., 32 pp.

T. Hansen, C.J. Wang; Support vector based battery state of charge estimator; Journal of Power Sources, 2004; 6391; pp. 1-8.

V. Johnson et al.; Temperature-Dependent Battery Models for High-Power Lithium-Ion Batteries; Jan. 2001; NREL/CP-540-28716; 17th Annual Electric Vehicle Symposium Oct. 15-18, 2000.

U.S. Appl. No. 12/819,617, filed Jun. 21, 2010 entitled Voltage Management Methods and Systems for Performing Analog-to-Digital Conversions.

U.S. Appl. No. 12/822,285, filed Jun. 24, 2010 entitled Battery Management System and Method for Transferring Data within the Battery Management System.

U.S. Appl. No. 12/870,940, filed Aug. 30, 2010 entitled Systems and Methods for Determining a Warranty Obligation of a Supplier to an Original Equipment Manufacturer for a Vehicle Battery Pack.

International Search Report; International Application No. PCT/KR2004/003001, International Filing Date: Nov. 19, 2004; Date of Mailing: Mar. 7, 2005; 1 page.

International Search Report; International Application No. PCT/KR2004/003104, International Filing Date: Nov. 29, 2004; Date of Mailing: Jul. 5, 2005; 2 pages.

International Search Report; International Application No. PCT/KR2005/003141, International Filing Date: Sep. 22, 2005; Date of Mailing: Nov. 18, 2005; 2 pages.

International Search Report; International Application No. PCT/KR2006/004682, International Filing Date: Nov. 9, 2006; Date of Mailing: Feb. 13, 2007; 2 pages.

International Search Report; International Application No. PCT/KR2006/005089, International Filing Date: Nov. 29, 2006; Date of Maililng: Mar. 9, 2007; 2 pages.

International Search Report; International Application No. PCT/KR2006/005090, International Filing Date Nov. 29, 2006; Date of Mailing: Mar. 19, 2007; 2 pages.

International Search Report; International Application No. PCT/KR2007/000360, International Filing Date: Jan. 22, 2007; Date of Mailing: May 8, 2007; 2 pages.

\* cited by examiner

BATTERY SYSTEM AND METHOD FOR INCREASING AN OPERATIONAL LIFE OF A BATTERY CELL

BACKGROUND

The inventor herein has recognized that replacing lithium-ion pouch-type battery cells in an electric-powered vehicle is relatively expensive.

Accordingly, the inventor herein has recognized there is a need for a battery system and a method for increasing an operational life of a battery cell.

SUMMARY

A battery system in accordance with an exemplary embodiment is provided. The battery system includes a battery cell and a heat exchanger disposed adjacent to the battery cell. The battery system further includes first and second frame members having the battery cell and the heat exchanger disposed therebetween. The first and second frame members are configured to be coupled together. The battery system further includes a fluid supply system configured to supply a coolant fluid to the heat exchanger and to receive the coolant fluid from the heat exchanger. The battery system further includes a voltage sensor configured to generate a first signal indicative of a voltage level output by the battery cell over a time interval. The battery system further includes a current sensor configured to generate a second signal indicative of a level of electrical current flowing through the battery cell over the time interval. The battery system further includes a microprocessor configured to calculate a resistance level of the battery cell based on the first and second signals. The microprocessor is further configured to generate a control signal to induce the fluid supply system to increase a pressure level of the coolant fluid being supplied to the heat exchanger to a first pressure level, based on the resistance level, such that an increased desired force is applied to at least one side wall of the battery cell.

A method for increasing an operational life of a battery cell in a battery system in accordance with another exemplary embodiment is provided. The battery system has first and second frame members having the battery cell and the heat exchanger disposed therebetween. The heat exchanger is disposed adjacent to the battery cell. The battery system further includes a fluid supply system fluidly coupled to the heat exchanger, and a microprocessor. The method includes generating a first signal indicative of a voltage level output by the battery cell over a time interval, utilizing a voltage sensor. The method further includes generating a second signal indicative of a level of electrical current flowing through the battery cell over the time interval, utilizing a current sensor. The method further includes calculating a resistance level of the battery cell based on the first and second signals, utilizing a microprocessor. The method further includes generating a control signal to induce the fluid supply system to increase a pressure level of the coolant fluid being supplied to the heat exchanger to a first pressure level, based on the resistance level, utilizing the microprocessor, such that an increased desired force is applied to at least one side wall of the battery cell.

DETAILED DESCRIPTION

Figure 1:
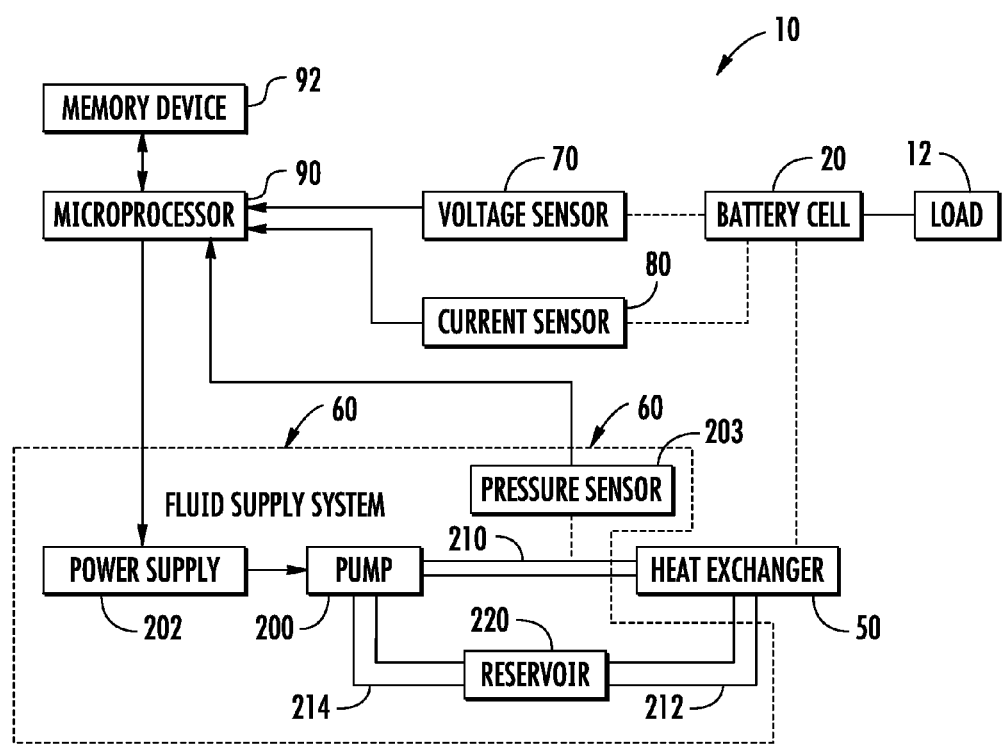
FIG. 1 is a block diagram of a battery system in accordance with an exemplary embodiment.
Figure 2:
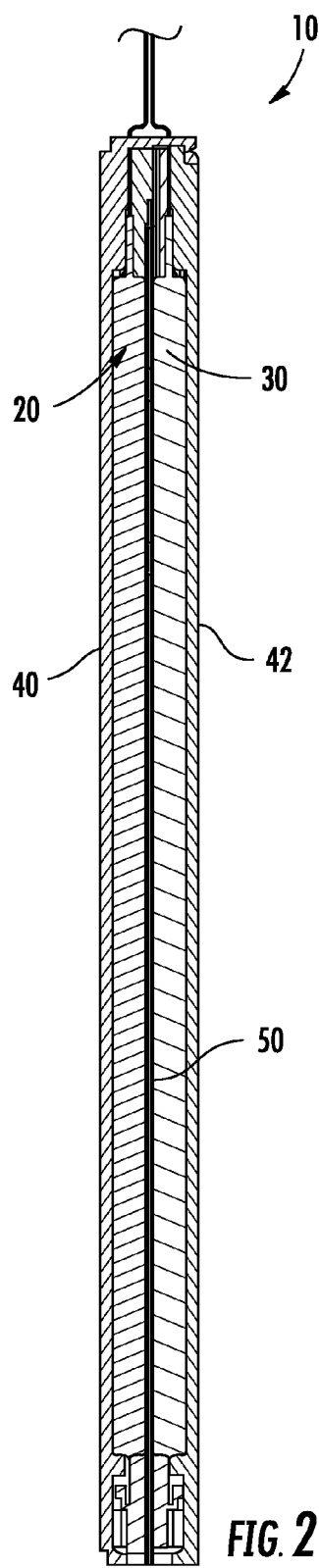
FIG. 2 is a schematic of battery cells, frame members, and a heat exchanger utilized in the battery system of FIG. 1.

Referring to FIGS. 1 and 2, a battery system 10 in accordance with an exemplary embodiment is illustrated. The battery system 10 includes battery cells 20, 30, first and second frame members 40, 42, a heat exchanger 50, a fluid supply system 60, a voltage sensor 70, a current sensor 80, a microprocessor 90, and a memory device 92.

Figure 10:
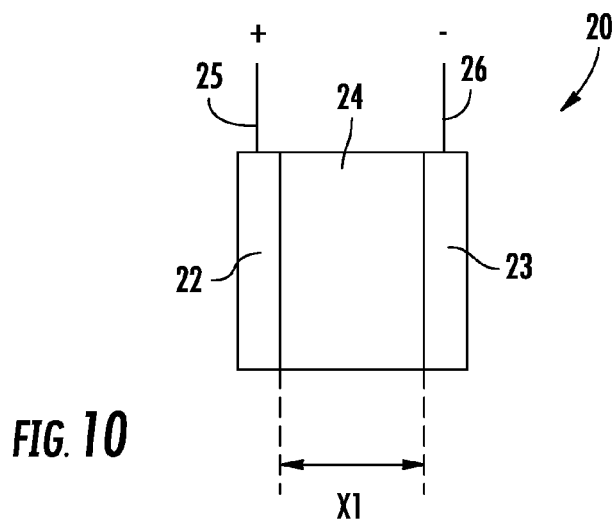
FIG. 10 is a simplified cross-sectional schematic of a battery cell.
Figure 11:
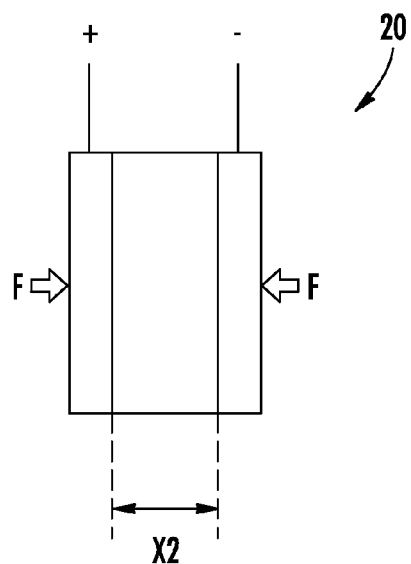
FIG. 11 is another simplified cross-sectional schematic of a battery cell that has been compressed.

Before providing a detailed explanation of the battery system 10, a general overview of a methodology for increasing an ion transfer efficiency and increasing an operational life of the battery cell 20 will be provided in order to better understand the functionality of the battery system 10. Although the battery system 10 has two exemplary battery cells, only the benefits associated with the battery cell 20 will be discussed in detail for purposes of simplicity. However, it should understood that the following methodology could be implemented with a single battery cell or a plurality of battery cells. Referring to FIG. 10, a simplified cross-sectional view of a portion of the pouch-type lithium-ion battery cell 20 is illustrated. The battery cell 20 includes active elements 22, 23, electrodes 25, 26, and a separator 24 having an electrolyte therein. The electrodes 25, 26 are coupled to the active elements 22, 23, respectively. During operation, ions from the active element 22 migrate through the separator 24 and an electrolyte in the separator 24 to the active element 23. Over an operational life of the battery cell 20, an ion transfer efficiency across the distance X1 between the active element 22 to the active element 23 is decreased. Accordingly, referring to FIG. 11, the inventor herein has recognized that after the battery cell 20 has a decreased ion transfer efficiency during its operational life, it would be beneficial to decrease a distance between the active element 22 and the active element 23. A decrease in distance between the active elements 22 and 23 can be obtained by applying a force (F) to side surfaces 110, 112 of the battery cell 20 which are pliable or flexible, to obtain a distance X2 between the active elements 22 and 23. The distance X2 is less than the distance X1. The battery system 10 is configured to apply the force (F) substantially uniformly and perpendicular to side surfaces 110, 112 of the battery cell 20 and to side surfaces 130, 132 of the battery cell 30 when the system 10 determines that the battery cell 20 has degraded operational characteristics based on a resistance level of the battery cell 20.

Figure 9:
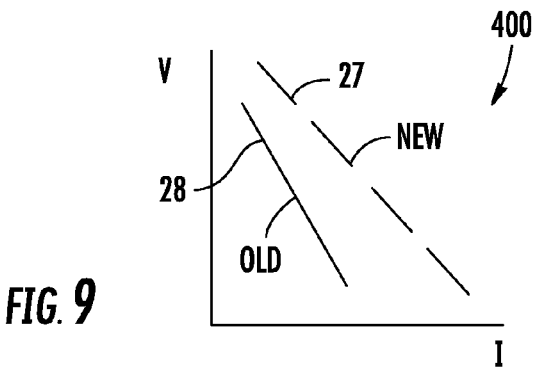
FIG. 9 is a schematic of voltage versus current curves associated with a battery cell.

Referring to FIG. 9, a graph 400 of voltage versus current curves associated with the battery cell 20 is illustrated. A resistance level of the battery cell 20 is indicated by a slope of each voltage versus current curve can be utilized to determine whether the battery cell has degraded operational characteristics. For example, the slope of the curve 27 corresponds to a new battery cell 20 and indicates a relatively low resistance level indicating a desired operational performance, and the slope of the curve 28 corresponds to an old battery cell 20 having a relatively high resistance level. The inventor herein has recognized that the resistance level associated with the battery cell can be utilized to determine degraded ion transfer efficiency of the battery cell 20, for determining an amount of force to apply to side surfaces 110, 112 of the battery cell 20 to increase an ion transfer efficiency and to increase an operational life of the battery cell 20.

Referring to FIGS. 1-3 and 10, the battery cells 20, 30 are provided to output voltages across respective terminals of the battery cells 20, 30 and are electrically coupled the load 12. In one exemplary embodiment, the battery cells 20, 30 are electrically coupled in series with one another and further coupled in series with the load 12. The battery cell 20 has a pouch-type body 100, electrodes 25, 26. The pouch-type body 100 has active elements 22, 23 therein and has side surfaces 110, 112. In one exemplary embodiment, the battery cell 20 is a pouch-type lithium-ion battery cell. Of course, in an alternative embodiment, the battery cell 20 could be another type of battery cell having pliable side walls known to those skilled in the art.

The battery cell 30 has a similar construction as the battery cell 20 and includes a pouch-type body 120, an electrode 122 and another electrode (not shown). The pouch-type body 120 has active elements therein and side surfaces 130, 132. In one exemplary embodiment, the battery cell 30 is a pouch-type lithium-ion battery cell. Of course, in an alternative embodiment, the battery cell 30 could be another type of battery cell having pliable side walls known to those skilled in the art.

Figure 3:
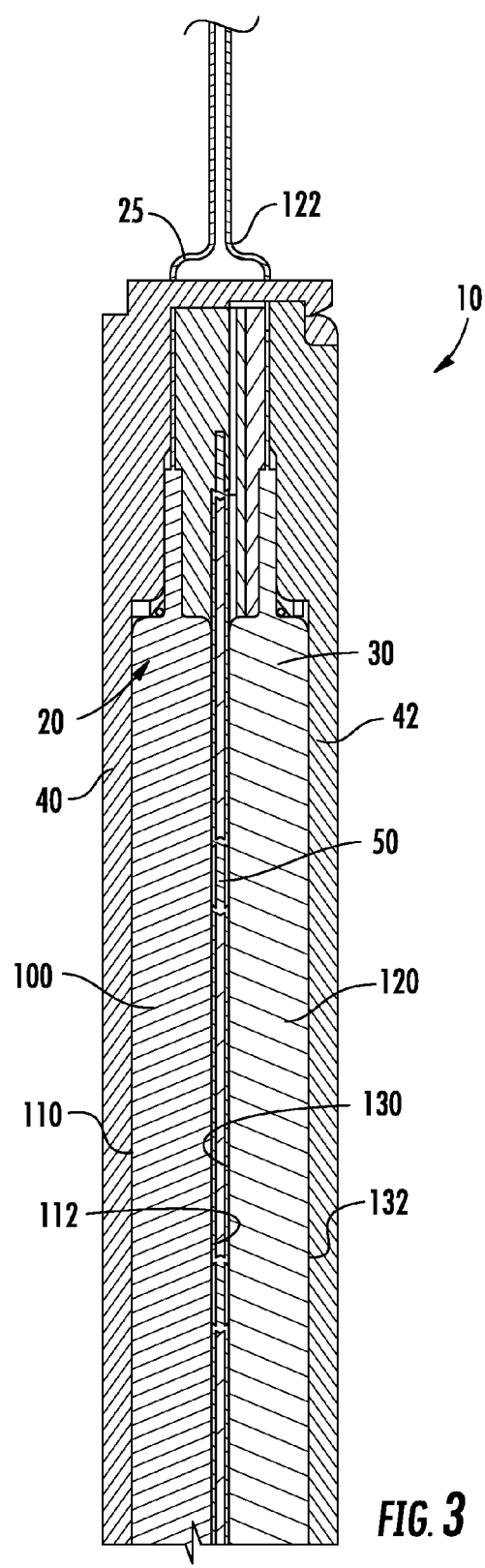
FIG. 3 is an enlarged cross-sectional schematic of a portion of the battery cells, frame members, and the heat exchanger of FIG. 2.
Figure 4:
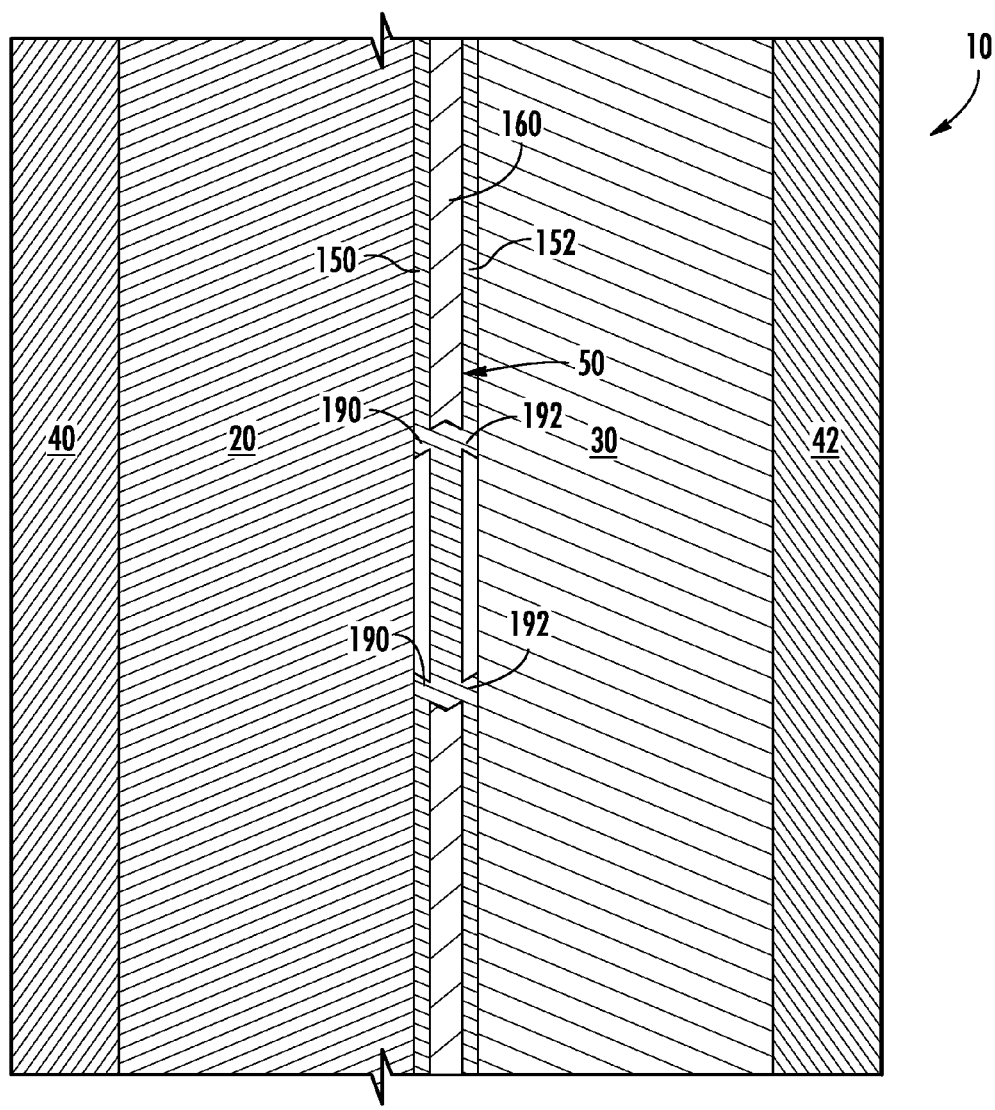
FIG. 4 is an enlarged cross-sectional schematic of a portion of the battery cells, frame members, and the heat exchanger of FIG. 3.
Figure 5:
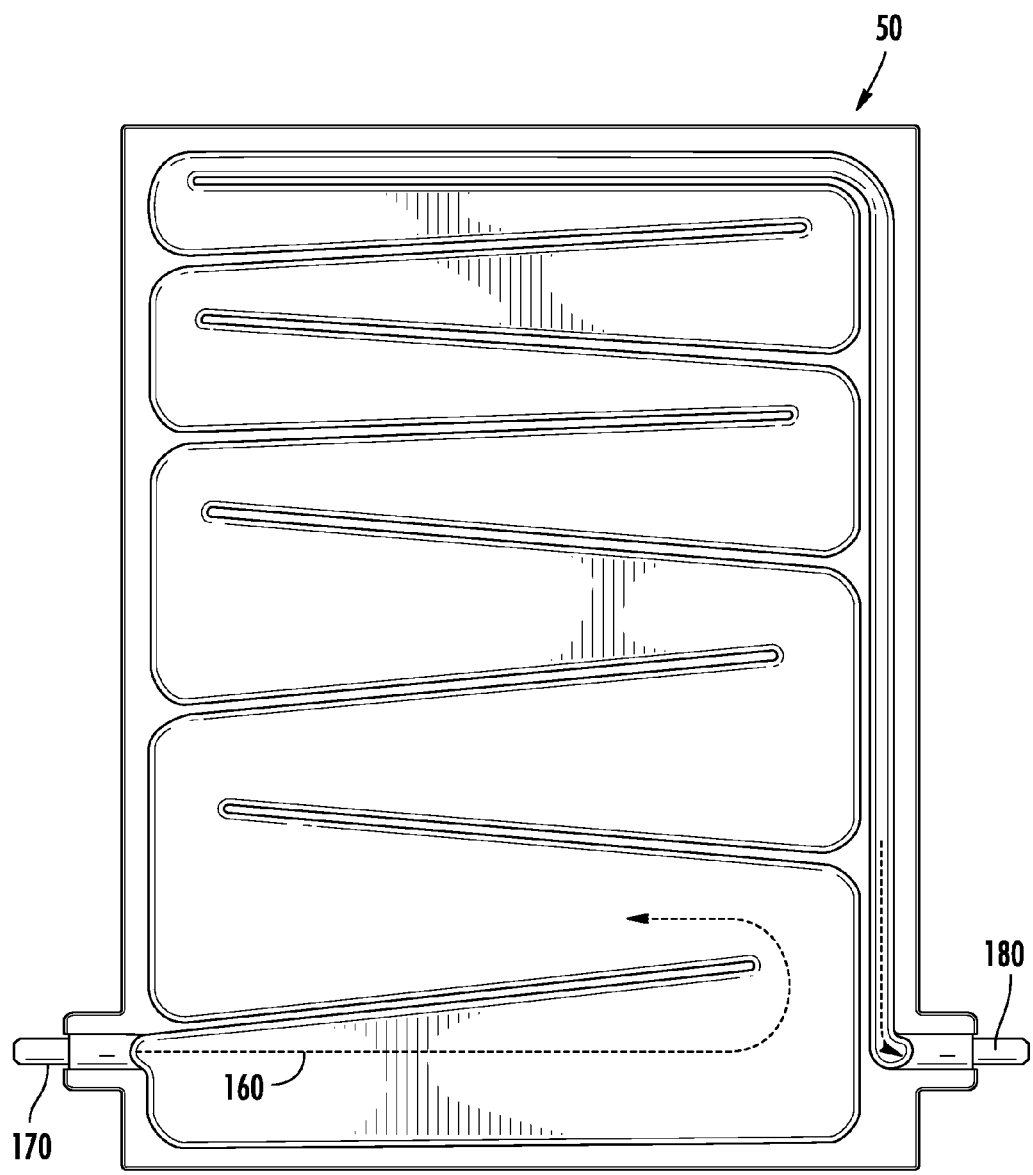
FIG. 5 is a cross-sectional schematic of the heat exchanger utilized in the battery system of FIG. 2.
Figure 6:
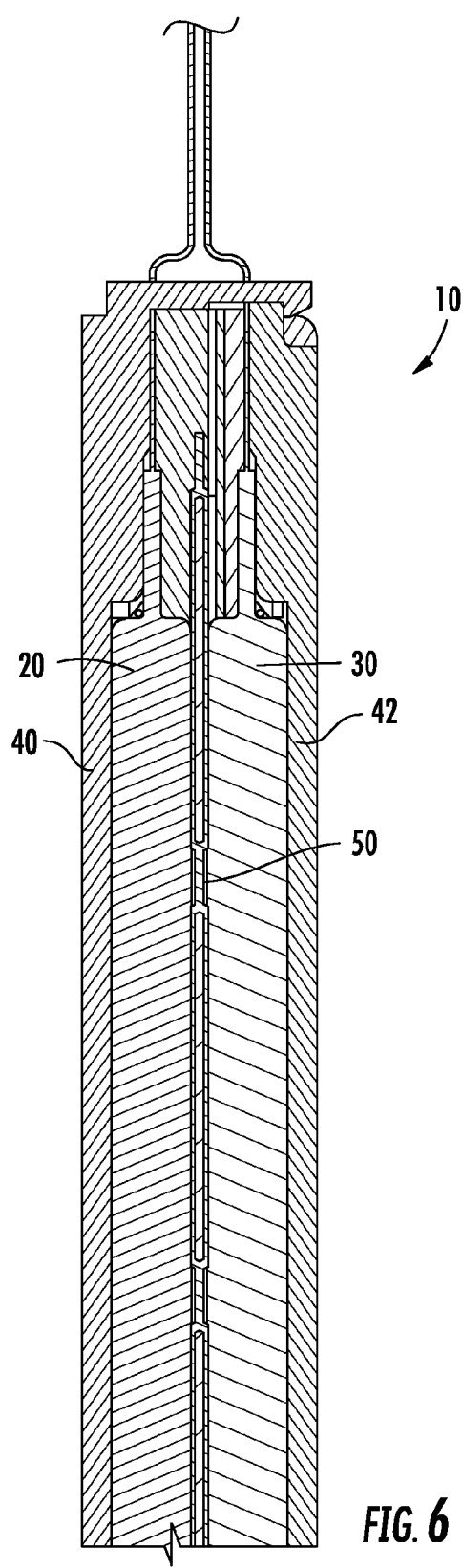
FIG. 6 is another enlarged cross-sectional schematic of a portion of the battery cells, frame members, and the heat exchanger of FIG. 1.
Figure 7:
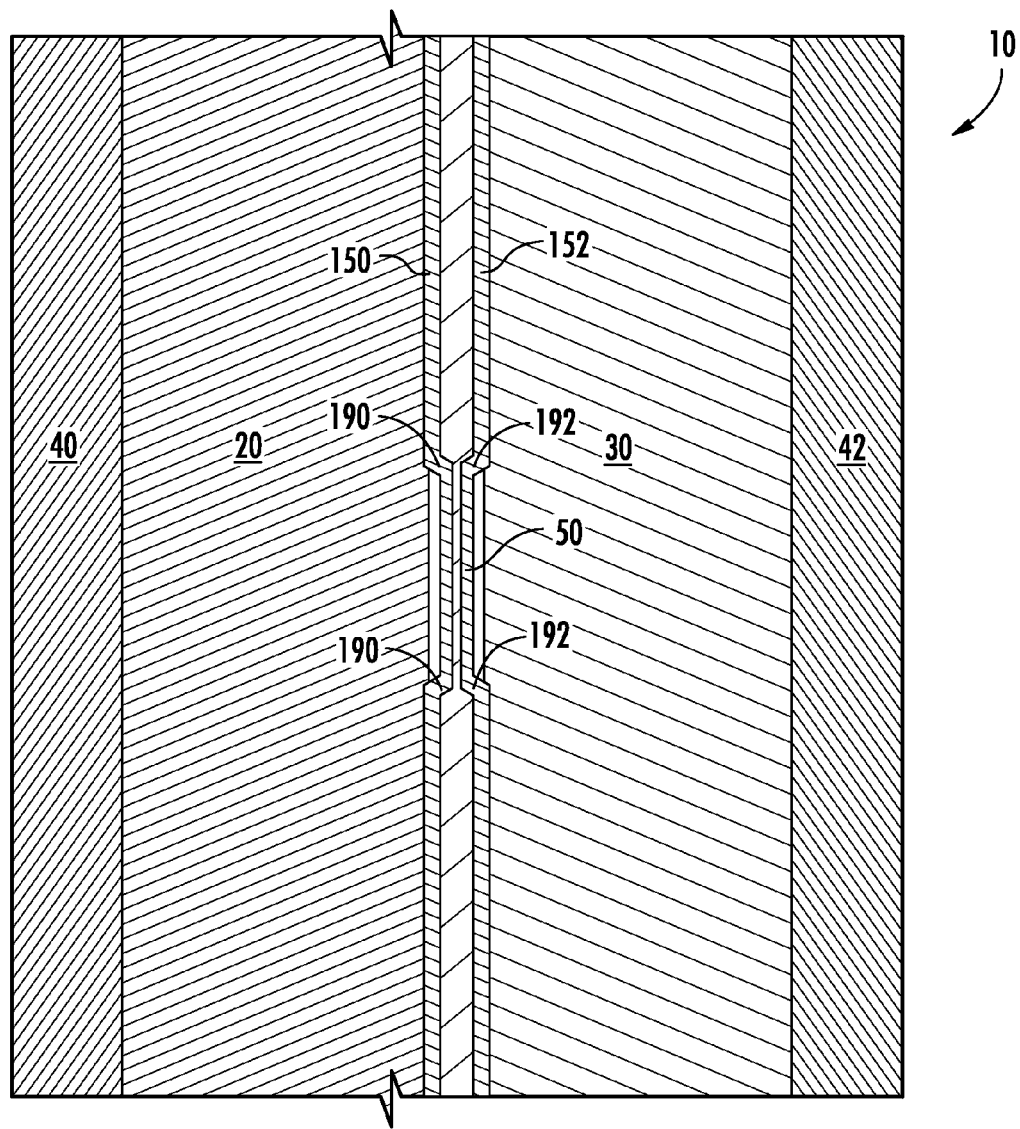
FIG. 7 is an enlarged cross-sectional schematic of a portion of the battery cells, frame members, and the heat exchanger of FIG. 6.

Referring to FIGS. 3-5, the heat exchanger 50 is disposed adjacent to and between the battery cells 20, 30. The heat exchanger 50 has a side walls 150, 152, an inlet port 170, and an outlet port 180. The side walls 150, 152 are coupled together and define a flow path 160 that extends from the inlet port 170 to the outlet port 180. In one exemplary embodiment, the side walls 150, 152 are constructed of aluminum. In an alternative embodiment, the side walls 150, 152 are constructed of stainless steel. Of course in other alternative embodiments, other types of materials known to those skilled in the art with the desired functional characteristics could be utilized. The side wall 150 defines a plurality of flexible portions 190, and the side wall 150 defines a plurality of flexible portions 192. Each of the flexible portions 190 is disposed proximate to a respective flexible portion 192. FIG. 4 illustrates a position of the flexible portions 190, 192 and of the side walls 150, 152 when a coolant fluid flowing through the heat exchanger 50 has a nominal or relatively low pressure level. FIGS. 6 and 7 illustrate a position of the flexible portions 190, 192 and the side walls 150, 152 when the coolant fluid flowing through the heat exchanger 50 has a relatively high pressure level (e.g., also referred to as a "first pressure level" herein). It should be noted that when the coolant fluid has relatively high pressure level, the flexible portions 190, 192 extend further outwardly to apply a substantially uniform force perpendicular to side surfaces 110, 112 of the battery cell 20 and side surfaces 130, 132 of the battery cell 30.

Referring to FIGS. 1 and 5, the inlet port 170 is fluidly coupled to the conduit 210, and the outlet port 180 is fluidly coupled to the conduit 212.

Referring to FIGS. 2 and 3, the first and second frame members 40, 42 have the battery cells 20, 30 and the heat exchanger 50 disposed therebetween. The first and second frame members 40, 42 are configured to be coupled together. In one exemplary embodiment, the first and second frame members 40, 42 are constructed of plastic. Of course, in alternative embodiments, the first and second frame members 40, 42 could be constructed of other materials known to those skilled in the art.

Referring to FIG. 1, the fluid supply system 60 is configured to supply a coolant fluid to the heat exchanger 50. The fluid supply system 60 includes a pump 200, a power supply 202, a pressure sensor 203, conduits 210, 212, 214, and a reservoir 220. The pump 200 is configured to pump coolant fluid from the reservoir 220 to the heat exchanger 50 via the conduit 210. The power supply 202 generates control signals for inducing the pump 202 to pump coolant fluid at desired pressure levels in response to receiving control signals from the microprocessor 90. The coolant fluid is pumped out of the heat exchanger 50 and through the conduit 212 to the reservoir 220. Thereafter, the coolant fluid is pumped out of the reservoir 220 through the conduit 214 back again to the pump 200. As shown, the conduit 210 is fluidly coupled between the pump 200 and heat exchanger 50. Also, the conduit 212 is fluidly coupled between the heat exchanger 50 and the reservoir 220, and the conduit 214 is fluidly coupled between the reservoir 220 and the pump 200. The pressure sensor 203 is configured to generate a signal indicative of a pressure level of the coolant fluid exiting the pump 200, which is received by the microprocessor 90, for closed loop control of the pressure level of the coolant fluid.

The voltage sensor 70 is configured to generate a first signal indicative of a voltage level output by the battery cell 20 over a time interval, which is received by the microprocessor 90.

The current sensor 80 is configured to generate a second signal indicative of a level of electrical current flowing through the battery cell 20 over the time interval to the load 12, which is received by the microprocessor 90.

The microprocessor 90 is operably coupled to the memory device 92, the voltage sensor 70, the current sensor 80, the pressure sensor 203, and the power supply 202. The microprocessor 90 is configured to calculate a resistance level of the battery cell 20 based on the first and second signals from the voltage sensor 70 and the current sensor 80, respectively. The microprocessor 90 is further configured to generate a control signal to induce the fluid supply system 60, and in particular the pump 200, to increase a pressure level of the coolant fluid being supplied to the heat exchanger 50 to a first pressure level, based on the resistance level, as will be explained in greater detail below. It should be noted that when the pressure level of the coolant fluid is increased to the first pressure level, the flexible portions 190, 192 extend outwardly such that the walls 150, 152 of the heat exchanger 50 apply an increased desired force substantially uniformly and perpendicular to the side surfaces 110, 112 of the battery cell 20 and to the side surfaces 130, 132 of the battery cell 30.

Figure 8:
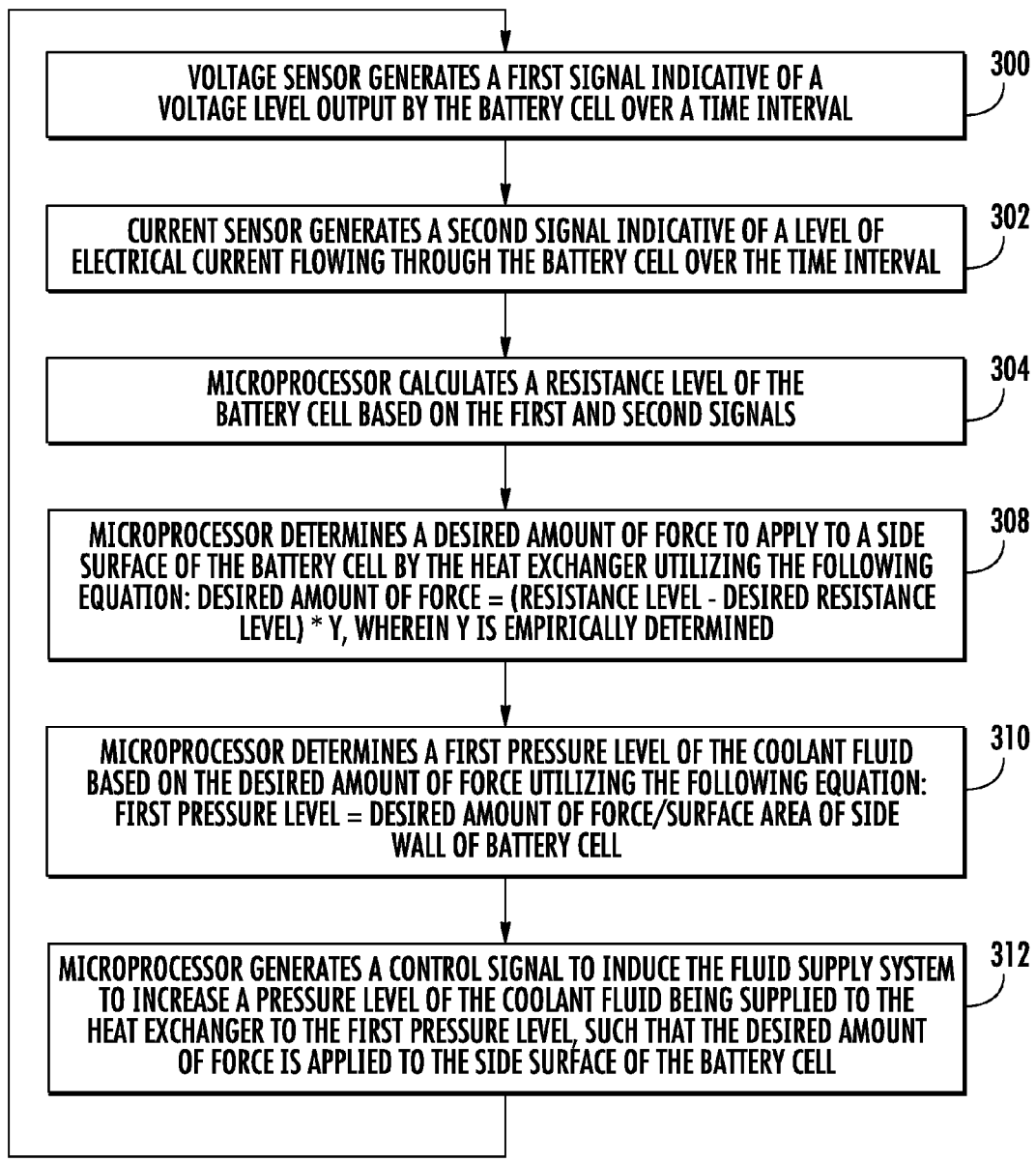
FIG. 8 is a flowchart of a method for increasing an operational life of a battery cell in a battery system in accordance with another exemplary embodiment.

Referring to FIGS. 1 and 8, a flowchart of a method for increasing an operational life of the battery cell 20 in the battery system 10 will now be explained. It should be noted that the following method also increases the operational life of the battery 30.

At step 300, the voltage sensor 70 generates a first signal indicative of a voltage level output by the battery cell 20 over a time interval.

At step 302, the current sensor 80 generates a second signal indicative of a level of electrical current flowing through the battery cell 20 over the time interval.

At step 304, the microprocessor 90 calculates a resistance level of the battery cell based on the first and second signals. In particular, the resistance level is calculated by dividing the voltage level by the level of electrical current.

At step 308, the microprocessor 90 determines a desired amount of force to apply to a side surface 112 of the battery cell 20 by the heat exchanger 50 utilizing the following equation: desired amount of force=(resistance level−desired resistance level)*Y, wherein Y is empirically determined.

At step 310, the microprocessor 90 determines a first pressure level of the coolant fluid based on the desired amount of force utilizing the following equation: first pressure level=desired amount of force/surface area of a side wall of battery cell 20.

At step 312, the microprocessor 90 generates a control signal to induce the fluid supply system 60 to increase a pressure level of the coolant fluid being supplied to the heat exchanger 50 to the first pressure level, such that the desired amount of force is applied to the side surface 112 of the battery cell 20.

The battery system 10 and the method for increasing an operational life of the battery cell provide a substantial advantage over other battery systems and methods. In particular, the battery system 10 and the method provide a technical effect of increasing an operational life of the battery cell by increasing a pressure level of coolant fluid being supplied to a heat exchanger such that an increased desired force is applied to at least one side surface of the battery cell. As a result of the increased desired force, a distance between active elements in the battery cell is reduced which improves the ion transfer efficiency between the active elements in the battery cell.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

I claim:

1. A battery system, comprising:
   a battery cell;
   a heat exchanger disposed adjacent to the battery cell;
   first and second frame members having the battery cell and the heat exchanger disposed therebetween, the first and second frame members being configured to be coupled together;
   a fluid supply system configured to supply a coolant fluid to the heat exchanger and to receive the coolant fluid from the heat exchanger;
   a voltage sensor configured to generate a first signal indicative of a voltage level output by the battery cell over a time interval;
   a current sensor configured to generate a second signal indicative of a level of electrical current flowing through the battery cell over the time interval;
   a microprocessor programmed to calculate an electrical resistance level of the battery cell based on the first and second signals; and
   the microprocessor programmed to generate a control signal to induce the fluid supply system to increase a pressure level of the coolant fluid being supplied to the heat exchanger to a first pressure level, based on the electrical resistance level, such that an increased force is applied to at least one side wall of the battery cell.

2. The battery system of claim 1, wherein the battery cell is a pouch-type lithium-ion battery cell.

3. The battery system of claim 1, wherein the heat exchanger is constructed from flexible side members that define an interior region therebetween, the coolant fluid flowing through the interior region.

4. A method for increasing an operational life of a battery cell in a battery system, the battery system having first and second frame members having the battery cell and the heat exchanger disposed therebetween, the heat exchanger being disposed adjacent to the battery cell, a fluid supply system fluidly coupled to the heat exchanger, and a microprocessor, the method comprising:
   generating a first signal indicative of a voltage level output by the battery cell over a time interval, utilizing a voltage sensor;
   generating a second signal indicative of a level of electrical current flowing through the battery cell over the time interval, utilizing a current sensor;
   calculating an electrical resistance level of the battery cell based on the first and second signals, utilizing a microprocessor; and
   generating a control signal to induce the fluid supply system to increase a pressure level of the coolant fluid being supplied to the heat exchanger to a first pressure level, based on the electrical resistance level, utilizing the microprocessor, such that the heat exchanger applies a predetermined amount of pressure to at least one side wall of the battery cell.

5. The method of claim 4, further comprising:
   determining a difference value indicating a difference between the electrical resistance level and a predetermined electrical resistance level, utilizing the microprocessor;
   determining the predetermined amount of pressure to apply to the at least one battery cell by the heat exchanger based on the difference value, utilizing the microprocessor; and
   determining the first pressure level of the coolant fluid based on the predetermined amount of pressure, utilizing the microprocessor.

6. A method for increasing an operational life of a battery cell in a battery system, the battery system having first and second frame members having the battery cell and the heat exchanger disposed therebetween, the heat exchanger being disposed adjacent to the battery cell, a fluid supply system fluidly coupled to the heat exchanger, and a microprocessor, the method comprising:
   generating a first signal indicative of a voltage level output by the battery cell over a time interval, utilizing a voltage sensor;
   generating a second signal indicative of a level of electrical current flowing through the battery cell over the time interval, utilizing a current sensor;
   calculating an electrical resistance level of the battery cell based on the first and second signals, utilizing a microprocessor; and generating a control signal to induce the fluid supply system to increase a pressure level of the coolant fluid being supplied to the heat exchanger to a first pressure level, based on the electrical resistance level, utilizing the microprocessor, such that the heat exchanger applies a predetermined amount of force to at least one side wall of the battery cell, the predetermined amount of force being applied substantially perpendicular to the at least one side wall.

7. The method of claim 6, further comprising:

determining a difference value indicating a difference between the electrical resistance level and a predetermined electrical resistance level, utilizing the microprocessor;

determining the predetermined amount of force to apply to the at least one battery cell by the heat exchanger based on the difference value, utilizing the microprocessor; and determining the first pressure level of the coolant fluid based on the predetermined amount of force, utilizing the microprocessor.

* * * * *